(12) United States Patent
Cherbettchian et al.

(10) Patent No.: US 6,254,934 B1
(45) Date of Patent: Jul. 3, 2001

(54) METHOD FOR CONTROLLED DEPOSITION OF MIRROR LAYERS

(75) Inventors: Agop H. Cherbettchian, Santa Monica; Martin Koran, Simi Valley; Lynette Ratkovic, Los Angeles; Alan F. Stewart, Thousand Oaks, all of CA (US)

(73) Assignee: Litton Systems, Inc., Woodland Hills, CA (US)

( * ) Notice: Subject to any disclaimer, the term of this patent is extended or adjusted under 35 U.S.C. 154(b) by 0 days.

(21) Appl. No.: 09/124,344

(22) Filed: Jul. 29, 1998

(51) Int. Cl.[7] .................................................. B05D 1/32
(52) U.S. Cl. ............................. 427/255.5; 427/282
(58) Field of Search .............................. 427/282, 255.5

(56) References Cited

U.S. PATENT DOCUMENTS 4,449,478 * 5/1984 Kraus ................................ 427/255.5
4,587,134 * 5/1986 Shimozato et al. .................. 427/251
5,843,235 * 12/1998 Bergman et al. .................... 427/282

* cited by examiner

Primary Examiner—Shrive Beck
Assistant Examiner—Kirsten A. Crockford

(57) ABSTRACT

A method and apparatus for depositing spatially substantially uniform layers of material onto a plurality of substrates positioned upon a rotatable tool within a vacuum chamber. The chamber is generally of the type that includes a sealable volume bounded by six orthogonally-arranged chamber walls. Apparatus is provided within the chamber for generating a flux of the coating material of known spatial character. A mask of predetermined shape is engaged to apparatus, including a linkage and a linear translation stage driven by a programmable stepper motor, for controllably advancing it during deposition with respect to the mounted substrate.

8 Claims, 4 Drawing Sheets

METHOD FOR CONTROLLED DEPOSITION OF MIRROR LAYERS

BACKGROUND

1. Field of the Invention

The present invention relates processes for fabricating mirrors suitable for use in precision instruments such as ring laser gyroscopes. More particularly, this invention pertains to a process for controlling the thickness of mirror layers deposited upon a mirror substrate within a deposition chamber.

2. Description of the Prior Art

The ring laser gyroscope is a rotation sensor that senses rotation about an axis that is perpendicular to the plane of a cavity formed within a frame, preferably of glass ceramic or other low thermal coefficient material. Highly polished mirrors are positioned at the corners of the cavities to direct the counterpropagating beams about the cavity. Beams of laser light circulate in opposite directions within the cavity. In accordance with the well-known Sagnac effect, the frequencies of the two beams are altered in opposite senses (i.e. one is increased while the other is decreased) by rotation about the axis and the beat frequency between the two beams then provides a measure of rotation.

Lasing is affected within the cavity by the interaction of photons with an excited medium which acts as an amplifier. In a d.c. configuration, the medium is excited by the interaction of a fill gas, typically HeNe, with flows of electrical current between electrodes arranged about or within the gyro frame. Alternatively, in an r.f. actuated device, the medium is excited by means of an electromagnetic field that oscillated at radio frequencies. Only two counterrotating lasing modes need to be supported within the lasing cavity to obtain a measure of rotation. In a planar cavity, the counterrotating beams are linearly polarized whereas a nonplanar cavity can support both right and left circularly-polarized modes.

As mentioned above, mirrors are provided at the corners of the cavity for directing the beams of light. In the case of a multioscillator or other multiple-cavity device the number of mirrors or optical elements will correspondingly increase. The precision and, for that matter, operability of a ring laser gyroscope is critically dependent upon the quality of the mirrors. Surface defects and unevenness can produce a multitude of device infirmities.

The fabrication of high reflectance mirrors for use in precision instruments such as ring laser gyroscopes involves the careful deposition of multiple layers of various material compositions. Multiple layers are required to provide the high reflectivity that is necessary to generate the feedback required for ring laser gyro operation. Without the necessary high reflectivity, the gyro may be unable to assume operation as it is a low gain oscillator. That is, successful gyro operation requires that gyro gain exceed losses for the desired oscillation to occur.

The need to deposit multiple layers of material multiplies the possible sources of mirror surface nonuniformity. The presence of nonuniform mirror layers may result in the creation of a visually observable color band across the mirror aperture showing a spatial distribution of frequency response that does not permit or severely impacts laser gyro operation.

The coating layers of a precision mirror are created through a variety of deposition processes. Such processes are conventionally performed within a coating chamber that essentially comprises a sealable vacuum box. Among the processes for depositing materials in such an environment are thermal evaporation, electron beam, ion beam and magnetron sputtering. FIG. 1 is a schematic view of the application of a mirror layer by one of such deposition processes within a coating chamber. Within the chamber, mirror substrates 10 are mounted upon a generally-planar rotatable tool 12 for receiving deposited material 14. The physics of each of the above-named processes is characterized by the generation of an inherently-nonuniform spatial distribution of coating material known as a "plume".

The inherent, generally-predictable shape of the plume generated of course complicates the task of depositing mirror layers of uniform thickness. Even with rotation of the tool 12, it is clear that thicker layers will be deposited upon the mirror substrates 10 located closest to the center of the tool since the plume shape reaches a maximum in this region. This is addressed in the prior art by the use of a shadow mask 16 as shown in the more complete schematic view of a chamber deposition process illustrated by FIG. 2. The mask 16 is held rigidly within the coating chamber and suspended above the tool 12 which may undergo either simple or complex rotation. The shape of the shadow mask 16 is successively trimmed until the desired uniformity of layer deposition in the presence of the plume-like emission of material is observed. Different types of coating tooling may require different masks as the tooling itself affects the uniformity of the coatings deposited. Small process variations or system maintenance may result in a condition where the size of the shadow mask is too small. This generally requires the fabrication of a new mask and the initiation of a new trimming sequence. Such a process is inherently trial and error, time consuming and neither particularly accurate nor predictable.

SUMMARY OF THE INVENTION

The present invention addresses the foregoing shortcomings of the prior art by providing, in a first aspect, an improvement in a method for depositing at least one layer of material from a spatially-distributed flux within a vacuum chamber onto at least one substrate in which a mask of predetermined shape is provided for spatially controlling the amount of material deposited. In such a method the improvement provided by the present invention resides in the step of controllably advancing the mask over the substrate tooling in accordance with a predetermined movement profile.

In a second aspect, the invention provides an improvement in a vacuum chamber of the type that includes a generally-rectangular sealable volume bounded by six orthogonal walls, a tool including a plurality of spatially-distributed surface apertures for exposing a plurality of substrates, means for generating a spatially-distributed flux of material within such volume and a mask for selectively shielding regions of the surface of the tool. The improvement provided by this aspect of the invention comprises means for controllably advancing the mask over the surface in accordance with a predetermined movement profile.

The preceding and additional features and aspects of this invention will become further apparent from the detailed description that follows. Such description is accompanied by a set of drawing figures in which numerals, corresponding to like numerals of the written description, point to the various features of the invention. Like numerals refer to like features throughout both the written description and the drawing figures.

DETAILED DESCRIPTION OF THE PREFERRED EMBODIMENT

Figure 1:
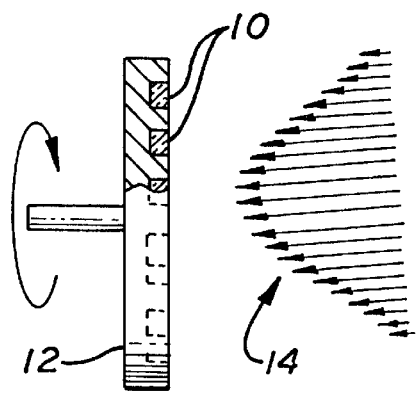
FIG. 1 is a schematic view of the basic elements of a coating chamber-based mirror layer deposition process.
Figure 2:
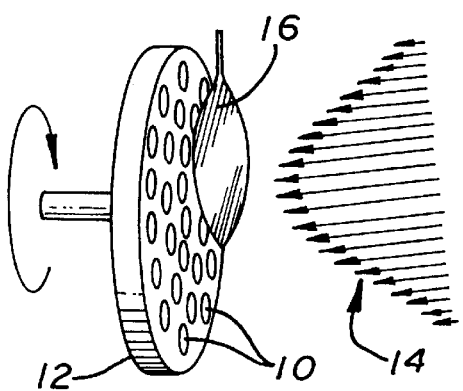
FIG. 2 is a second schematic view of a coating chamber-based process with shadow mask included for counteracting the spatial distribution of material.
Figure 3:
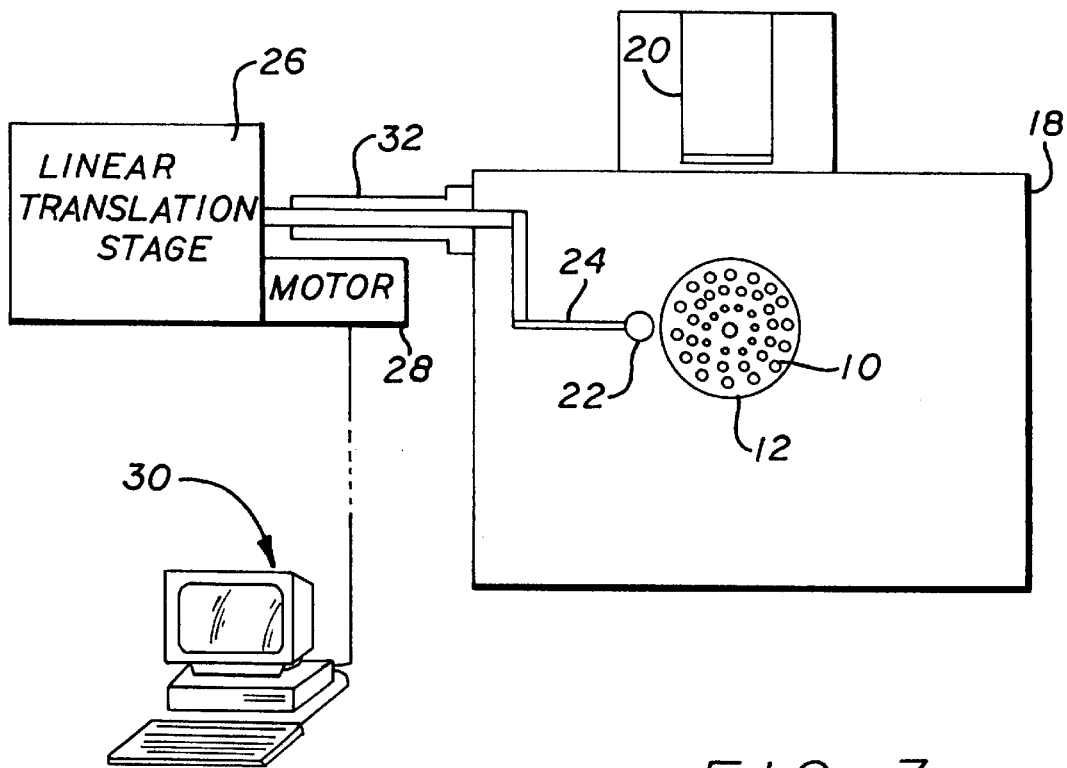
FIG. 3 is a schematic view illustrating the coating chamber based components of the mirror layer deposition process of the invention.

FIG. 3 is a schematic view that illustrates the components of apparatus for deposition of mirror layers in accordance with the invention. The invention is mounted within a vacuum coating chamber 18 having an associated ion gun 20 for emitting a plume-like spatial distribution of coating material as discussed with reference to FIGS. 1 and 2 above. (The ion gun 20 emits a beam of ions toward a target with material ejected from the target surface forming the plume.) While the invention is disclosed in FIG. 3 for use with an ion beam deposition process, it will be appreciated that the teachings of this invention are equally appropriate for use with other coating processes characterized by a spatially-distributed output of coating material for impinging upon the surface of a rotatable tool 12 that carries a plurality of mirror substrates 10.

A small mask 22 is fixed to the distal end of an arm of a rigid mechanical linkage 24 that is connected to a linear translation stage 26 driven by a stepper motor 28. The motor 28 is controlled by means of a programmable controller 30.

The linear translation stage 26, as mentioned earlier, is coupled to the mask 22 through a linkage 24. A bellows push-pull vacuum feedthrough 32 is provided within a wall of the chamber 18 for enabling the introduction and operation of the linkage 24 within the interior of the vacuum coating chamber 18.

For simplicity, a circular mask 22 (as opposed to the intricately-crafted masks of the prior art) has been assumed in a simulation of the present invention. While not critical, it is important that the size of the mask 10 fall within certain broad parameters. The inventors' initial attempts to model a mask of radius equal to one-tenth the radius of the tool 12 failed to demonstrate analytical conversion as discussed below as they have found that there exists a fundamental relationship between mask size (and shape), the relative size of the deposition profile and the magnitude of the nonuniformity of the deposition profile. Mask size cannot be too small as the mask would cover only a smart part of the profile. On the other hand, too large a mask would result in only crude control of the deposition profile since dwell times would necessarily be short compared to the time required for deposition of a coating layer. The use of a circular mask in the model does not mean to imply exclusivity or even optimization. Rather, this shape is employed for purposes of simplicity, realizing that other shapes such as rectangles, pie-shaped wedges, arrowheads or spoon designs may be employed with the scope of the present invention.

Figure 4A:
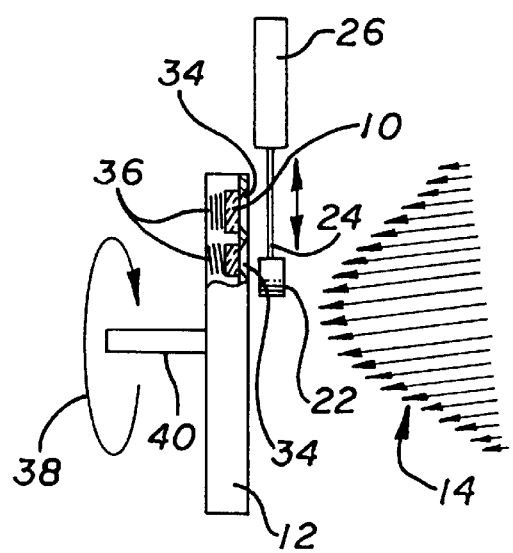
FIGS. 4(a) and 4(b) are a side view partially in section and a top plan view respectfully for illustrating both apparatus and the method of the present invention.
Figure 4B:
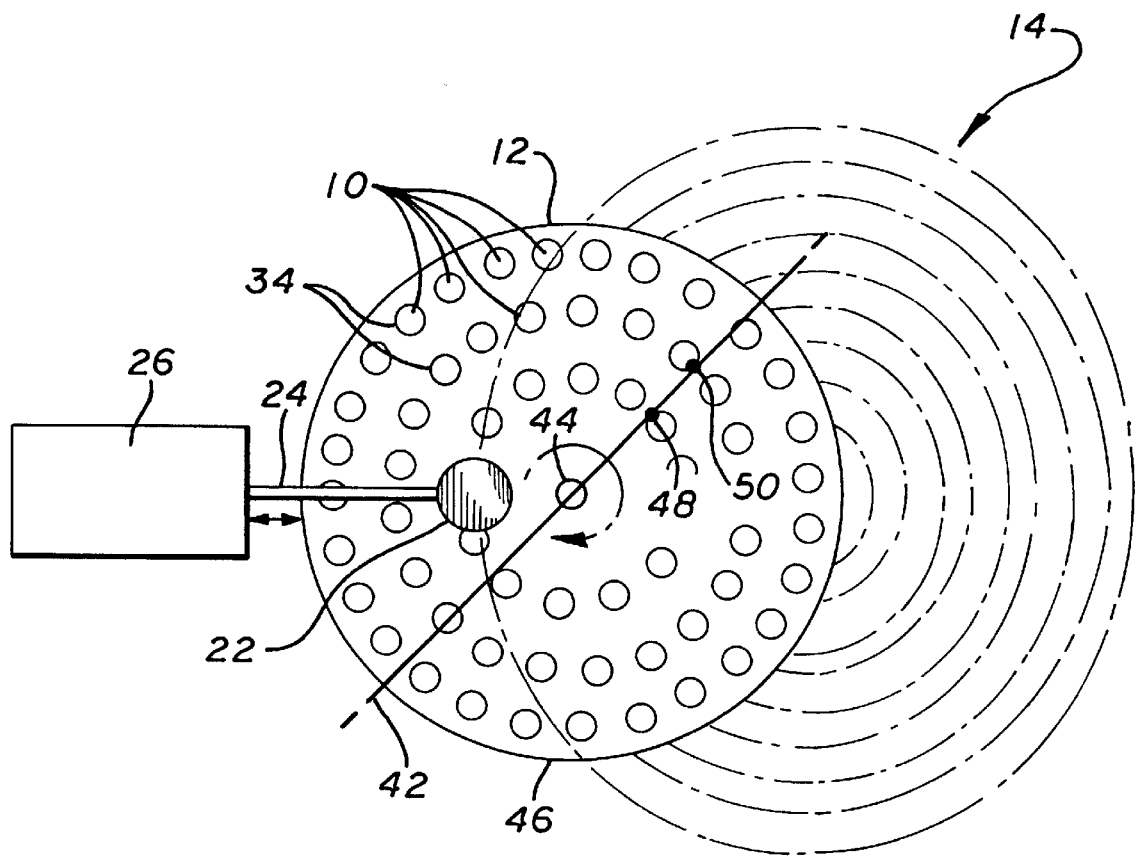

FIGS. 4(a) and 4(b) are a side view partially in section and a top plan view respectively illustrating the present invention. In contrast to prior art approaches that employ a carefully-crafted shadow mask whose position is fixed within the vacuum coating chamber 18, mechanisms, described above, are provided in the present invention for linearly translating the position of the mask 22 during the deposition process.

As seen in FIG. 4(a), the mask 22 is advanced linearly through translation of the linkage 24 in response to the stepper motor driven linear translation stage 26. As the position of the mask 22 is advanced, it passes over rows of substrates 10 held against surface apertures 34 of the tool 12 by means of springs 36.

As the same time that the position of the mask 22 is linearly advanced over the tool 12, the tool 12 undergoes either simple or complex rotation 38 about a central shaft 40. This process may be observed more clearly in FIG. 4(b). As can be seen, the apertures 34 in the tool 12 which expose the spring-loaded substrates 10, are arranged into a plurality of circular rows of varying diameter. For purposes of the discussion that follows, the position of the mask 22 is defined with respect to the circular row of apertures 34 it overlies. Referring to the diametrical line 42 of FIG. 4(b), a "zeroeth position" is defined to exist at the center of rotation 44 of the tool 12 with the value being incremented successively as one moves toward the circumference 46. Thus, the innermost circular row of apertures 36 comprises "position 1" (denoted 48), the row of next-largest radial distance from the center of rotation comprises "position 2" (denoted 50), etc.

In the invention, in contrast to the fixed mask of the prior art, the small mask 22 is moved or scanned across the surface of the rotating coating tool 12. With proper attention paid to absolute positioning, the dwell time of the mask 22 at each radial position over the coating tool 12 determines the effective size of the mask 22. By increasing the dwell time of the mask at a given radial position, the effect of a larger shadow mask at that radius is created with respect to the coating tool 12. Given that the total time required for a quarter wave optical thickness coating is typically greater than 600 seconds for ring laser gyroscope mirrors, the scan speed required is not great. A single scan across the radius of the coating tool 12 must be completed during the time required for a complete quarter wave layer. (In fact, as only thickness control of the mirrors fabricated is relevant, the mask 22 need only be scanned across the apertures 34 of mirrors in each row of the coating tooling.) For certain applications, it may be advantageous to employ multiple cycles of the scan during each quarter wave layer fabrication as it is well known that the optical properties of the coating material deposited may change during the formation of a layer.

In the invention, a linear travel profile is determined for the shadow mask 22. Such profile is dependent upon a number of factors, including the shape of the mask 22, the size of the tool 12, the size of the apertures 36 and the type and rate of rotation of the tool 12. "Dwell time" is employed to describe how long the mask 22 remains in one position during coating. For a self-consistent result, the time index employed is the period of rotation for the coating tool 12 under the mask 22. In programming the linear translation stage 26, only whole numbers of complete rotations of the coating tool 12 are provided for each position of the mask 22.

As mentioned earlier, a large number of variables must be solved simultaneously to create a linear translation profile, the solution of which is within the knowledge and capabilities of those skilled in the art. The goal of any profile is measured with regard to uniformity of layer deposition and maximum throughput. The dwell times for each mask position are coupled to one another as adjacent points on the tool 12 are physically connected. In an actual application, such coupling was incorporated into the program by listing, at each radius on the tool 12, the sum total effect of masked positions to the left, centered on, and to the right of the radius of the tool 12. The mask shape and size defines the number of masked positions which affect each radius on the tool 12. For instance, a mask which is five units in radius will produce eleven terms in the summation. A mask with a radius of ten units will contribute twenty-one terms, etc. The resultant deposition profile with fixed dwell times is then iteratively adjusted for uniformity by adding a number of rotations of the tool 12 with no mask present and solving for the best combination. The best combination of masked and unmasked rotations is then re-analyzed to determine its resultant deposition profile. Where the deposition profile is thick, the dwell times during masking are increased. Where the deposition is too thin, the dwell times during masking are reduced. The process is then begun again. After a number of iterations, convergence to a solution will occur, producing an improved deposition profile. In order to observe this optimization process, the deposition profile is graphed at each iteration of the dwell time array.

Figure 5A:
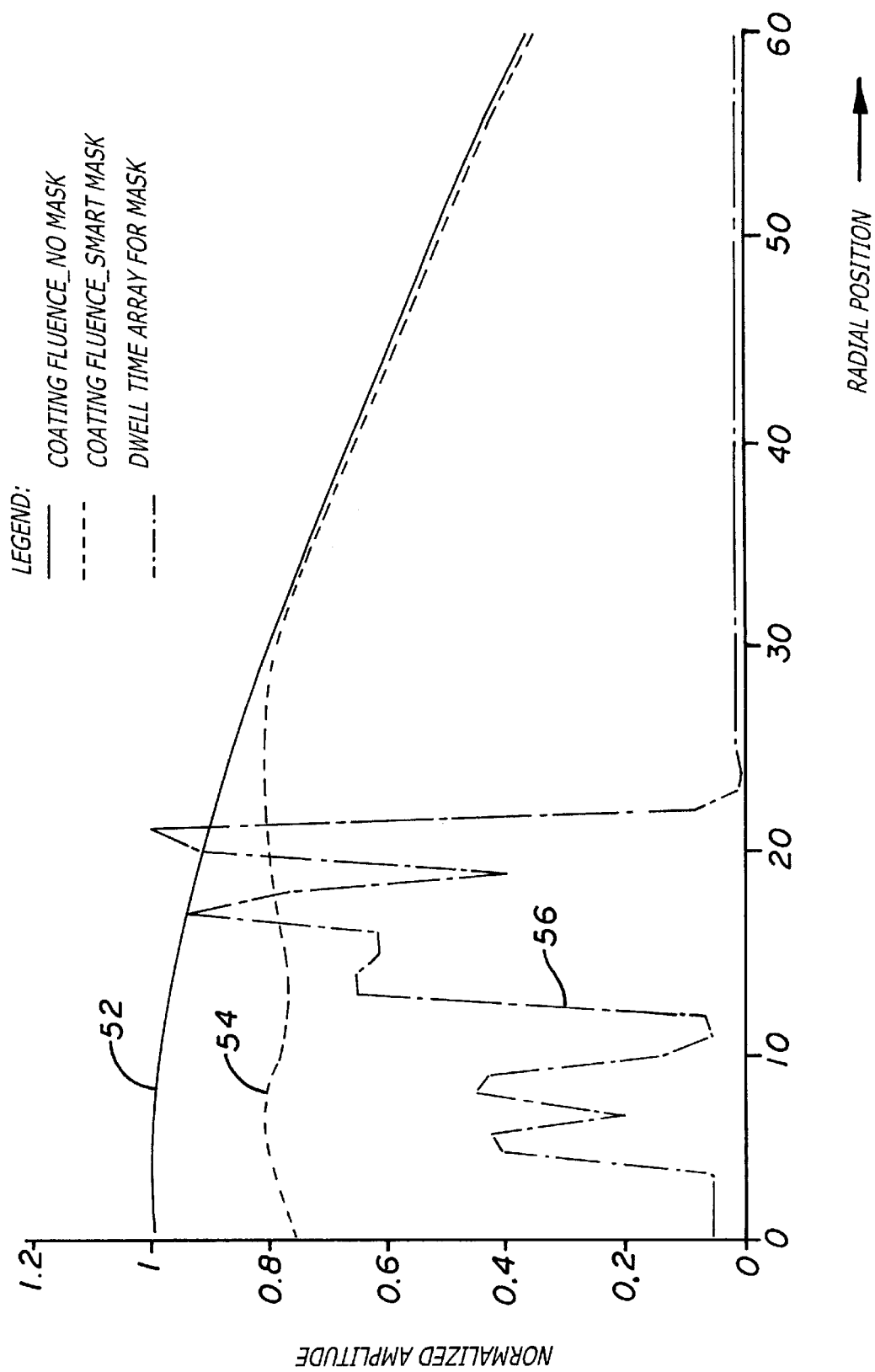
FIGS. 5(a) and 5(b) are graphical representations of simulations that illustrate resultant layer thicknesses (coating fluence) across a rotatable coating tool created by the method of the invention with and without an auxiliary fixed mask, respectively.
Figure 5B:
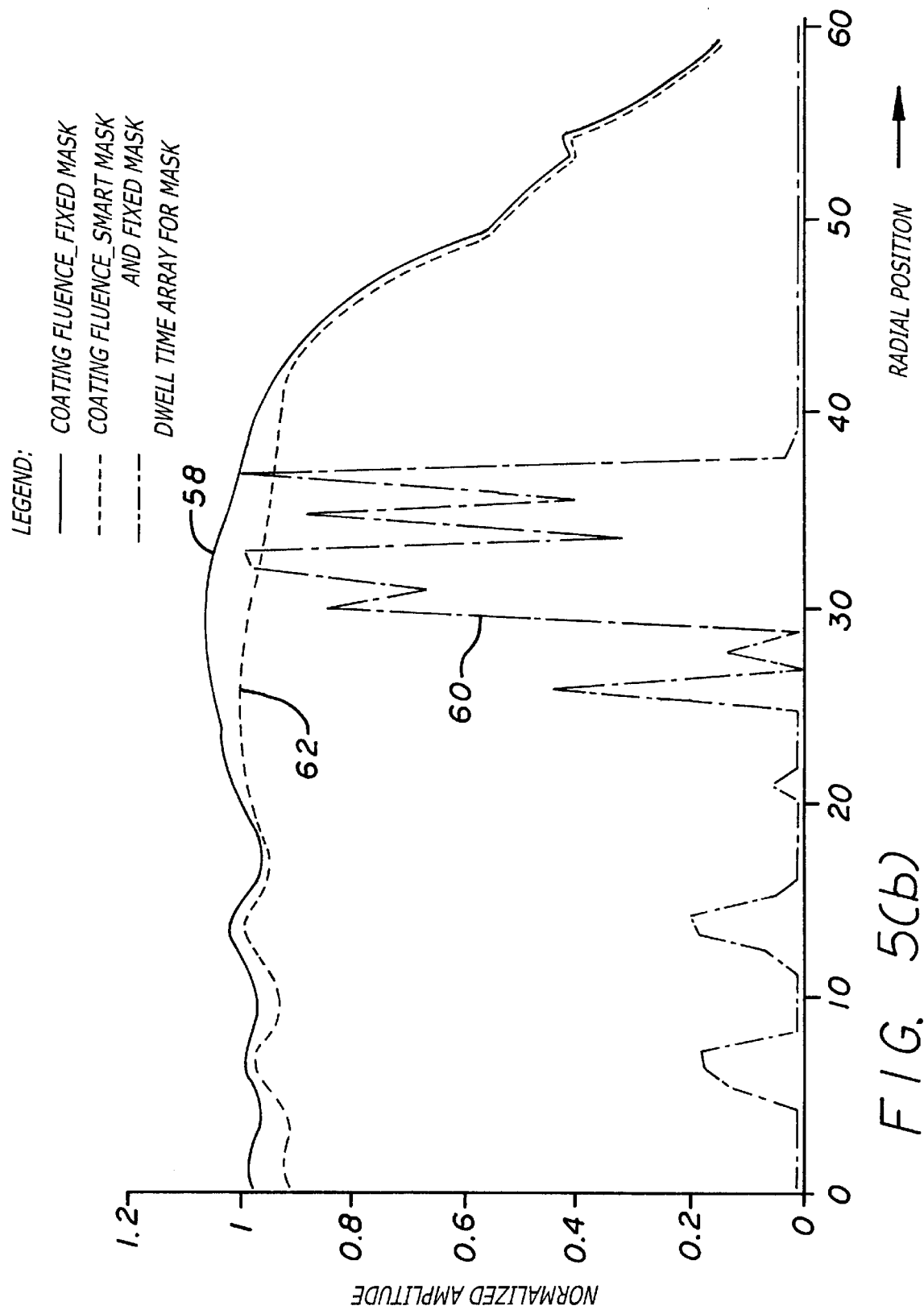

FIGS. 5(a) and 5(b) are graphical representations of simulations that illustrate resulting layer thicknesses (coating fluence) across a rotatable coating tool created by the method of the invention with and without an auxiliary fixed mask respectively. Prior to discussing such simulations, it should be kept in mind that the method of the invention can be employed in conjunction with a fixed mask to "fine tune" the resultant deposition profile or the plume of coating material reaching the substrates mounted upon the coating tool. Thus, the invention may be employed as a substitute for present-day fine-tuning techniques such as the repositioning of a fixed mask within a deposition chamber. Commonly, such fine tuning of the position of a fixed mask cannot eliminate variations on the order of a few percent in thickness across the tooling in a non-ion beam sputtering coating process. Such variation is quite serious for many high precision applications.

One inherent limitation associated with the use of a fixed mask for regulating the deposition of material onto a coating tool which moves in simple rotation is the singularity at the center of the tooling. That is, the fixed mask will either cover the center of the tooling or not, resulting either in a hole at the center of the tooling (no coating material deposited) or a thickened coating. An approach commonly employed involves fixing the mask a relatively large distance above the tooling to permit some material to get around it as the plume is not completely unidirectional. The coating thickness profile deposited on the tooling near the center is extremely sensitive to the mask size and shape—more so than at larger radii on the tooling. The mask size near the center is, by definition, nearly a needle point and tuning it is quite difficult.

In contrast, the center of the tooling is no different from any other location when the method of the present invention is employed. The total time that the mask dwells over the center of the tooling is only a fraction of the total process time, providing an obvious and significant advantage.

FIG. 5(a) is a graph of the result of a simulation of the method of the invention. A curve 52 plots the intensity of the coating plume as a function of radial distance (plotted as the abscissa) from the center of a rotating coating tool. The thickness profile of material deposition is indicated by the bold curve 54 while the timing profile as a function of radial position (dwell time in units of revolutions of the coating tool) is plotted as curve 56. As can be seen, by employing the method of the invention, the material deposition profile (curve 54) substantially flattens over a substantial portion of the coating tool. It may be noted that the curves 52 and 54 converge approximately midway between the center and remote edge of the coating tool. This results from the fact that the presence of any mask (stationary or moving) can only limit the amount of material deposited. Thus, one can take the simulation of FIG. 5(a) as representative of a coating process in which substrates are clustered toward the central portion of the tool.

FIG. 5(b) provides a similar graph which illustrates the method of the invention employed in conjunction with a fixed mask. The presence of the fixed mask alone would result in a thickness profile 58 across the coating tool. In contrast, by linearly advancing a coating mask in accordance with a dwell time profile 60 one can effectively fine-tune the fixed mask profile to an appreciably-improved deposition thickness profile 62. Thus, the utility of employing the method of the invention for fine tuning in conjunction with a fixed mask is shown.

In practice, implementation of the process requires measurement of the deposition profile without masking. A trial mask size may then be generated and modeled. The mask is installed in the coating chamber 18 with the control program employing the dwell times and positions from the model. The resultant deposition profile is then measured. There is little difference between optimization in the model and optimization in the coating chamber as both involve analysis of the resultant profile and adjustment of the mask dwell times.

A feature of the model that is assumed to be adjustable, but usually is not, is the total number of rotations of the tool for creating a given layer. Typically, a fixed rotation speed is employed. The only true requirement for the model is that rotation speed be sufficiently high that each rotation represent only a small fraction of the total time required per layer. The smallest time index that can be employed is the time for one revolution of the tool. The higher the speed, the better the possible time resolution and the more uniform the resultant deposition profile. A fixed rotation speed can thus be accommodated in the model. Typical rotation speeds in coating systems are 10 to 75 r.p.m. with layer times ranging up to thirty minutes.

Thus it is seen that the present invention provides apparatus and an improved method for forming uniform layers for use in high quality mirrors. The teachings of this invention may be employed to other deposition processes, including the manufacture of integrated circuits, optical coatings for eyeglasses and architectural glass.

By employing the teachings of this invention, one can overcome numerous shortcomings of the prior art. Such shortcomings are principally related to the disadvantages of the fixed-mask techniques of the prior art. Such prior art practices are hampered by the difficulty of crafting a shadow mask of suitable shape for repeatable results. This has led in the past to the re-configuration of an "initial" mask size through multiple iterations. Further, as successive layers of material for forming a mirror will generally differ, the optimal shape of the fixed shadow mask will likely differ from layer to layer. Accordingly, a compromise shape must be employed yielding a non-optimal solution for either one of the materials or layers in the process.

While the present invention has been described with reference to its presently-preferred embodiment, it is not limited thereto. Rather, this invention is limited only insofar as it is defined by the following set of patent claims and includes within its scope all equivalents thereof.

What is claimed is:

1. In a method for depositing at least one layer of material from a flux spatially dispersed within a vacuum chamber onto at least one substrate wherein a mask of predetermined shape is provided for spatially controlling the amount of material deposited, the improvement comprising the steps of:

a) mounting said at least one substrate to a substantially-planar tool having at least one apreture for admitting said material; and b) rotating said tool about an axis perpendicular to said planar tool; and c) controllably advancing said mask along a line intersecting said axis while said material is deposited.

2. A method as defined in claim 1 wherein the step of moving further comprises the step of controllably advancing said mask multiple times during formation of said at least one coating layer.

3. A method as defined in claim 2 wherein the step of advancing said mask multiple times includes the step of reversing the direction of linear travel of said mask during formation of said at least one layer.

4. A method as defined in claim 1 wherein said mask is of regular geometric shape.

5. A method as defined in claim 1 wherein said mask is circular.

6. A method as defined in claim 1 wherein the step of controllably advancing further includes the step of reversibly linearly advancing.

7. A method as defined in claim 6 wherein the step of reversibly linearly advancing further includes the step of reversibly linearly advancing said mask a plurality of times.

8. A method as defined in claim 1 wherein:

a) said tool includes a plurality of apertures arranged into at least two concentric rings centered at said axis of rotation; and b) said mask is controllably advanced along said line so that said mask overlies each of said at least two distinct concentric rings for predetermined periods of time.

* * * * *